United States Patent
Tamura

[19]
[11] Patent Number: 5,825,034
[45] Date of Patent: Oct. 20, 1998

[54] METHOD OF COMPENSATION FOR ELECTRON BEAM DOSE

[75] Inventor: Takao Tamura, Tokyo, Japan

[73] Assignee: NEC Corporation, Tokyo, Japan

[21] Appl. No.: 917,293

[22] Filed: Aug. 25, 1997

[30] Foreign Application Priority Data

Aug. 23, 1996 [JP] Japan ................................. 8-222239

[51] Int. Cl.⁶ ................................................. H01J 37/304
[52] U.S. Cl. ........................ 250/397; 250/492.2; 250/398
[58] Field of Search .................................. 250/397, 398, 250/492.2, 492.22, 492.23

[56] References Cited

U.S. PATENT DOCUMENTS 5,449,915  9/1995  Yamada et al. .................... 250/397

*Primary Examiner*—Kiet T. Nguyen
*Attorney, Agent, or Firm*—Young & Thompson

[57] ABSTRACT

A method of compensation to an electron beam dose for exposing an electron beam through an electron dose mask to an object is provided, which comprises the steps of measuring an actual opening area of the electron dose mask, and setting an optimum dose to the electron beam dose system with reference to the measured actual opening area of the electron dose mask, thereby forming on a wafer a pattern exactly corresponding to the designed pattern even if the electron beam mask has an opening pattern differing in size from the designed pattern.

16 Claims, 4 Drawing Sheets

FIG. 3
PRIOR ART

| | (1) | | (2) |
|---|---|---|---|
| Exposure: | D1 | = | D2 |
| Opening Area of Mask: | S1 | > | S2 |
| Pattern Size: | L1 | > | L2 |

FIG. 5

| | (1) | | (2) |
|---|---|---|---|
| Exposure: | D1 | < | D2 |
| Opening Area of Mask: | S1 | > | S2 |
| Pattern Size: | L1 | = | L2 |

METHOD OF COMPENSATION FOR ELECTRON BEAM DOSE

BACKGROUND OF THE INVENTION

The present invention relates to a method of compensation for electron beam dose, and more particularly to a method of compensation for electron beam dose to be carried in graphic one-shot drawing.

With progression of LSI, the reduction in scale of the semiconductor device has been on the progression whereby the size down of the patterns has been on the progression. For example, sub-micron order fine patterns are required. The electron beam dose is an effective dose method for enabling the required size reduction of pattern, for example, down to less than 0.25 micrometers.

A conventional electron beam dose system has been used which is as illustrated in FIG. 1. The conventional electron beam dose system has an electron gun 1 which emits an electron beam 50. A sampling stage 12 is provided so that a semiconductor wafer 11 is placed on the sampling stage 12. The electron beam 50 is emitted and traveled toward the semiconductor wafer 11. A pair of blanking electrodes 2 is symmetrically provided at opposite sides of the electron beam. A first aperture 3 is provided on a straight course of the electron beam 50. The first aperture 3 is distanced from the blanking electrodes 2 in the traveling direction of the electron beam 50. The first aperture 3 has a square-shaped opening 3A so that the electron beam 50 is defined by the square-shaped opening 3A of the first aperture 3 into a square-sectioned electron beam 50A. A molded leas 4 is provided on the straight course of the electron beam 50. The molded lens 4 is distanced from the first aperture 3 in the traveling direction of the square-sectioned electron beam 50A. A pair of molded deflectors 5 is symmetrically provided at opposite sides of the traveling straight course of the square-sectioned electron beam 50A. The molded deflectors 5 are distanced from the molded lens 4 in the traveling direction of the square-sectioned electron beam 50A. A second aperture 6 is provided on the traveling straight course of the square-sectioned electron beam 50A. The second aperture 6 is distanced from the molded deflectors 5 in the traveling direction of the square-sectioned electron beam 50A. The second aperture 6 has a square-shaped opening 6A but which is positioned to have a displacement whereby a square-sectioned overlapping part of the square-sectioned electron beam 50A passes through the square-shaped opening 6A so that the square-sectioned electron beam 50A is defined by the square-shaped opening 6A of the second aperture 6 into a rectangular-sectioned electron beam 50B. A reducing lens 7 is further provided on the traveling straight course of the rectangular-sectioned electron beam 50B. The reducing lens 7 is distanced from the second aperture 6 in the traveling direction of the rectangular-sectioned electron beam 50B. A pair of main deflectors 8 is symmetrically provided at opposite sides of the traveling straight course of the rectangular-sectioned electron beam 50B. The main deflectors 8 are distanced from the reducing lens 7 in the traveling direction of the rectangular-sectioned electron beam 50B. A pair of subordinate deflectors 9 is symmetrically provided at opposite sides of the traveling straight course of the rectangular-sectioned electron beam SOB. The subordinate deflectors 9 are distanced from the main deflectors 8 in the traveling direction of the rectangular-sectioned electron beam 50B. Further, a projection lens 10 is provided on the traveling straight course of the rectangular-sectioned electron beam 50B. The projection lens 10 is distanced from the subordinate deflectors 9 in the traveling direction of the rectangular-sectioned electron beam 50B. The rectangular-sectioned electron beam 50B is then irradiated onto the semiconductor wafer 11 held on the sampling stage 12 so that one shot dose operation of the rectangular-sectioned electron beam 50B onto a photo-resist over the semiconductor wafer 11 is repeated until a complete image pattern is formed on the photo-resist. The above electron beam dose system has the following problem. It is necessary to carry out a large number of the shots to form the required complete image pattern. It takes an extensively long time to complete the required image pattern on the photo-resist. The processing time for the electron beam dose system is so long. This makes it difficult to realize the required mass-production by use of the electron beam dose technique.

In recent years, the graphic one-shot drawing was proposed to settle the above problem. An electron beam dose system is illustrated in FIG. 2 wherein an electron beam mask is incorporated in an optical system. A plurality of patterns have already been prepared on the electron beam mask so that die plurality of the patterns are drawn on the wafer by one shot of electron beam dose. This method reduces the number of shots required for one chip. This improves the throughput.

With reference to FIG. 2, a conventional one-shot electron beam dose system has an electron gun 1 which emits an electron beam 50. A sampling stage 12 is provided so that a semiconductor wafer 11 is placed on the sampling stage 12. The electron beam 50 is emitted and traveled toward the semiconductor wafer 11. A pair of blanking electrodes 2 is symmetrically provided at opposite sides of the electron beam. A first aperture 3 is provided on a straight course of the electron beam 50. The first aperture 3 is distanced from the blanking electrodes 2 in the traveling direction of the electron beam 50. The first aperture 3 has a square-shaped opening 3A so that the electron beam 50 is defined by the square-shaped opening 3A of the first aperture 3 into a square-sectioned electron beam 50A. A molded lens 4 is provided on the straight course of the electron beam 50. The molded lens 4 is distanced from the first aperture 3 in the traveling direction of the square-sectioned electron beam 50A. A pair of molded deflectors 5 is symmetrically provided at opposite sides of the traveling straight course of the square-sectioned electron beam 50A. The molded deflectors 5 are distanced from the molded lens 4 in the traveling direction of the square-sectioned electron beam 50A. A second aperture 6 is provided on the traveling straight course of the square-sectioned electron beam 50A. The second aperture 6 is distanced from the molded deflectors 5 in the traveling direction of the square-sectioned electron beam 50A. The second aperture 6 has a plurality of opening patterns 6A having been already prepared thereon as one-shot cell. The square-sectioned electron beam 50A is defined by the opening patterns 6A of the second aperture 6 into a plural pattern defined electron beam 50B having the same patterns as the plurality of opening patterns 6A. A reducing lens 7 is further provided on the traveling straight course of the plural pattern defined electron beam 50B. The reducing lens 7 is distanced from the second aperture 6 in the traveling direction of the plural pattern defined electron beam 50B. A pair of main deflectors 8 is symmetrically provided at opposite sides of the traveling straight course of the plural pattern defined electron beam 50B. The main deflectors 8 are distanced from the reducing lens 7 in the traveling direction of the plural pattern defined electron beam 50B. A pair of subordinate deflectors 9 is symmetrically provided at opposite sides of the traveling straight course of the plural pattern defined electron beam 50B. The subordinate deflectors 9 are distanced from the main deflectors 8 in the traveling direction of the plural pattern defined electron beam 50B. Further, a projection lens 10 is provided on the traveling straight course of the plural pattern defined electron beam 50B. The projection lens 10 is distanced from the subordinate deflectors 9 in the traveling direction of the plural pattern defined electron beam 50B. The rectangular-sectioned electron beam 50B is then irradiated onto the semiconductor wafer 11 held on the sampling stage 12 so that one shot dose operation of the plural pattern defined electron beam 50B onto a photo-resist over the semiconductor wafer 11 may form a complete required image pattern 11B on the photo-resist.

The above one-shot electron beam dose system carries out one shot whilst the above first conventional electron beam dose system carries out many shots such as ten shots or one hundred shots. The number of the necessary shots for the one-shot electron beam dose system is about one tenth or one one-hundredth. This reduces the necessary time for forming the complete image patterns on the photo-resist over the semiconductor wafer. This also improves the throughput thereof The above one-shot electron beam dose system, however, has the following problem. If the electron beam mask is different from the design size, then the patterns formed on the photo-resist over the semiconductor wafer is also different from the design size.

In the Japanese laid-open patent publication No. 2-40910, it is disclosed to compensate a difference in size of the electron beam from the design size due to deflection errors for the purpose of dose of the electron beam having the optimum beam size so as to rise the accuracy in size of the patterns formed on the photo-resist.

If the above one-shot electron beam dose system is used, then it is however impossible to compensate the electron beam size because the size pattern is defined by the electron beam mask having been provided on the aperture.

The difference in size of the electron beam mask is caused by variation in conditions for processes. FIG. 3 is a view illustrative of openings of electron beam masks and patterns formed on the semiconductor wafer in the conventional one-shot electron beam dose system. The opening patterns illustrated in the left upper portion of FIG. 3 are free of any difference in size from the designed patterns. The opening patterns free of any difference in size from the designed patterns have a mask opening area S1. An optimum dose D1 depends upon the mask opening area S1 of the opening patterns free of any difference in size from the designed patterns. In this case, patterns to be formed on the wafer has the same size as the designed patterns L1. In contrast, if the opening patterns 6B are different in size from the designed pattern 6A as illustrated in FIG. 3, at right upper portion, then the opening area S2 of the opening patterns 6B is smaller than the opening area of the designed pattern. In this case, if an dose D2 is equal to the above optimum dose D1, then patterns 11B are formed on the wafer which are smaller in size than the designed patterns 11A. Namely, the patterns 11B have the size L2 which is smaller than the designed patterns 11A.

Further, it takes a few weeks or a few months to prepare the electron beam mask, for which reason re-preparation of the electron beam mask makes it difficult to shorten the total processing.

It is, however, unavoidable that even if the electron beam mask has an opening pattern differing in size from the designed pattern, then it is possible to form on the wafer a pattern exactly corresponding to the designed pattern.

In the above circumstances, it had been required to develop a novel method of compensation for one-shot electron beam dose to form on the wafer a pattern exactly corresponding to the designed pattern even if the electron beam mask has an opening pattern differing in size from the designed pattern.

SUMMARY OF THE INVENTION

Accordingly, it is an object of the present invention to provide a novel method of compensation for one-shot electron beam dose free from the above problems.

It is a further object of the present invention to provide a novel method of compensation for one-shot electron beam dose to form on the wafer a pattern exactly corresponding to the designed pattern even if the electron beam mask has an opening pattern differing in size from the designed pattern.

It is a still further object of the present invention to provide a novel electron beam dose free from the above problems.

It is yet a further object of the present invention to provide a novel electron beam dose to form on the wafer a pattern exactly corresponding to the designed pattern even if the electron beam mask has an opening pattern differing in size from the designed pattern.

The above and other objects, features and advantages of the present invention will be apparent from the following descriptions.

The present invention also provides an electron beam dose system comprising the following elements. A sampling stage is provided for holding a wafer. An emitter is provided for emitting an electron beam gun toward the wafer. The emitter may comprise an electron gun. An optical system is provided between the emitter and the sampling stage for allowing a travel of the electron beam onto the wafer. The optical system has at least an electron beam mask having an opening pattern through which the electron beam is defined and passes. An electron beam compensation system may further comprises a measuring device for measuring an actual opening area of the electron dose mask, and a setting device being electrically connected to the measuring device for fetching the measured actual opening area of the electron dose mask and setting an optimum dose to the electron beam dose system, thereby forming on a wafer a pattern exactly corresponding to the designed pattern even if the electron beam mask has an opening pattern differing in size from the designed pattern.

The present invention also provides a method of compensation to an electron beam dose for exposing an electron beam through an electron dose mask to an object. The method comprising the steps of measuring an actual opening area of the electron dose mask, and setting an optimum exposure to the electron beam dose system with reference to the measured actual opening area of the electron dose mask, thereby forming on a wafer a pattern exactly corresponding to the designed pattern even if the electron beam mask has an opening pattern differing in size from the designed pattern.

BRIEF DESCRIPTIONS OF THE DRAWINGS

Preferred embodiments according to the present invention will be described in detail with reference to the accompanying drawings.

FIG. 3 is a view illustrative of opening patterns of electron beam mask and patterns formed on a wafer when the second conventional electron beam dose system was used.

FIG. 5 is a view illustrative of opening patterns of electron beam mask and patterns formed on a wafer when a novel electron beam dose system is used.

DISCLOSURE OF THE INVENTION

Figure 1:
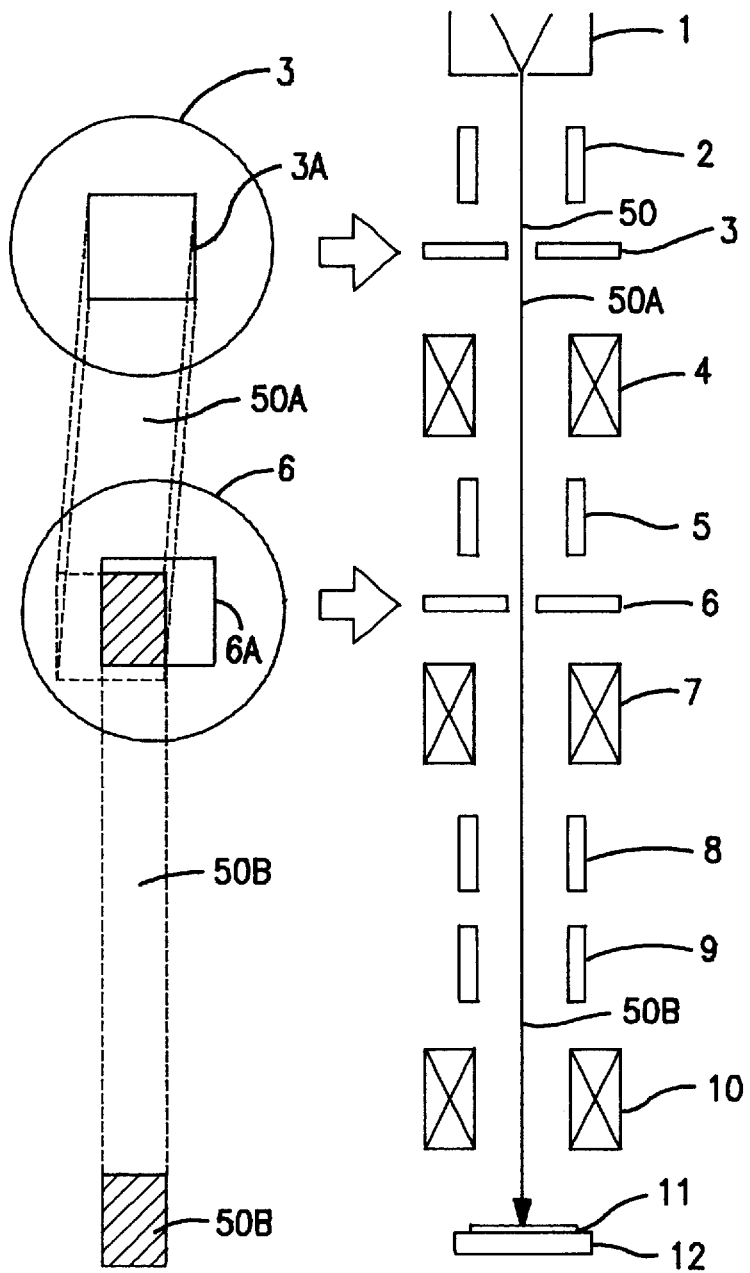
FIG. 1 is a block diagram illustrative of the first conventional electron beam dose system.

The present invention provides a compensation device for compensating an electron beam exposure to an object. The system is provided in an electron beam exposure system utilizing an electron exposure mask. The compensation device comprises the following elements. A detector is provided for detecting a current of an electron beam to which the object is exposed. A memory is provided for previously storing informations about relationships between an opening area and an optimum dose. A computer is provided which is electrically connected to the detector for fetching an detected current of the electron beam from the detector and calculating an actual opening area of the electron dose mask on the basis of the fetched current of the electron beam. The computer is also connected to the memory for fetching the informations about the relationships between the opening area and the optimum dose to decide an optimum dose on the basis of the calculated actual opening area of the electron dose mask. A controller is electrically connected to the computer for fetching the decided optimum dose and controlling an dose time of the electron beam dose in accordance with the fetched optimum dose, thereby forming on a wafer a pattern exactly corresponding to the designed pattern even if the electron beam mask has an opening pattern differing in size from the designed pattern.

The present invention also provides a compensation device for compensating an electron beam dose to an object. The system is provided in an electron beam dose system utilizing an electron dose mask. The compensation device comprises the following elements. A detector is provided for detecting a size of an electron beam having passed through the electron dose mask. A memory is provided for previously storing informations about relationships between an opening area and an optimum dose. A computer is electrically connected to the detector for fetching an detected size of the electron beam from the detector and calculating an actual opening area of the electron dose mask on the basis of the fetched size of the electron beam. The computer is also connected to the memory for fetching the informations about the relationships between the opening area and the optimum dose to decide an optimum dose on the basis of the calculated actual opening area of the electron dose mask. A controller is provided which is electrically connected to the computer for fetching the decided optimum dose and controlling an dose time of the electron beam dose in accordance with the fetched optimum exposure, thereby forming on a wafer a pattern exactly corresponding to the designed pattern even if the electron beam mask has an opening pattern differing in size from the designed pattern.

The present invention also provides an electron beam dose system comprising the following elements. A sampling stage is provided for holding a wafer. An emitter is provided for emitting an electron beam gun toward the wafer. The emitter may comprise an electron gun. An optical system is provided between the emitter and the sampling stage for allowing a travel of the electron beam onto the wafer. The optical system has at least an electron beam mask having an opening pattern through which the electron beam is defined and passes. An electron beam compensation system may further comprises the following elements. A detector is provided for detecting a current of an electron beam to which the object is exposed. A memory is provided for previously storing informations about relationships between an opening area and an optimum dose. A computer is provided which is electrically connected to the detector for fetching an detected current of the electron beam from the detector and calculating an actual opening area of the electron dose mask on the basis of the fetched current of the electron beam. The computer is also connected to the memory for fetching the informations about the relationships between the opening area and the optimum exposure to decide an optimum dose on the basis of the calculated actual opening area of the electron dose mask. A controller is provided which is electrically connected to the computer for fetching the decided optimum dose and controlling an dose time of the electron beam exposure in accordance with the fetched optimum dose; thereby forming on a wafer a pattern exactly corresponding to the designed pattern even if the electron beam mask has an opening pattern differing in size from the designed pattern.

The present invention also provides an electron beam dose system comprising the following elements. A sampling stage is provided for holding a wafer. An emitter is provided for emitting an electron beam gun toward the wafer. An optical system is provided between the emitter and the sampling stage for allowing a travel of the electron beam onto the wafer. The optical system has at least an electron beam mask having an opening pattern through which the electron beam is defined and passes. An electron beam compensation system may further comprises the following elements. A detector is provided for detecting a size of an electron beam having passed through the electron beam mask. A memory is provided for previously storing informations about relationships between an opening area and an optimum dose. A computer is provide which is electrically connected to the detector for fetching an detected size of the electron beam from the detector and calculating an actual opening area of the electron dose mask on the basis of the fetched size of the electron beam. The computer is also connected to the memory for fetching the informations about the relationships between the opening area and the optimum dose to decide an optimum dose on the basis of the calculated actual opening area of the electron dose mask. A controller is provided which is electrically connected to the computer for fetching the decided optimum dose and controlling an dose time of the electron beam dose in accordance with the fetched optimum dose, thereby forming on a wafer a pattern exactly corresponding to the designed pattern even if the electron beam mask has an opening pattern differing in size from the designed pattern.

The present invention also provides a compensation device for compensating an electron beam dose to an object. The compensation device is provided in an electron beam dose system utilizing an electron dose mask. The compensation device comprises the following elements. A measuring device is provided for measuring an actual opening area of the electron dose mask. A setting device is provide which is electrically connected to the measuring device for fetching the measured actual opening area of the electron dose mask and setting an optimum dose to the electron beam dose system, thereby forming on a wafer a pattern exactly corresponding to the designed pattern even if the electron beam mask has an opening pattern differing in size from the designed pattern.

It is preferable that the measuring device comprises a detector for detecting a current of an electron beam to which the object is exposed, and a computer being electrically connected to the detector for fetching an detected current of the electron beam from the detector and calculating an actual opening area of the electron dose mask on the basis of the fetched current of the electron beam.

It is also preferable that the measuring device comprises a detector for detecting a size of an electron beam having passed through the electron dose mask, and a computer being electrically connected to the detector for fetching an detected size of the electron beam from the detector and calculating an actual opening area of the electron dose mask on the basis of the fetched size of the electron beam.

It is also preferable that the setting device comprises a memory for previously storing informations about relationships between an opening area and an optimum dose, a computer being connected to the memory for fetching the informations about the relationships between the opening area and the optimum dose to decide an optimum dose on the basis of the calculated actual opening area of the electron dose mask, and a controller being electrically connected to the computer for fetching the decided optimum dose and controlling an dose time of the electron beam dose in accordance with the fetched optimum dose.

The present invention also provides an electron beam dose system comprising the following elements. A sampling stage is provided for holding a wafer. An emitter is provided for emitting an electron beam gun toward the wafer. The emitter may comprise an electron gun. An optical system is provided between the emitter and the sampling stage for allowing a travel of the electron beam onto the wafer. The optical system has at least an electron beam mask having an opening pattern through which the electron beam is defined and passes. An electron beam compensation system may further comprises a measuring device for measuring an actual opening area of the electron dose mask, and a setting device being electrically connected to the measuring device for fetching the measured actual opening area of the electron dose mask and setting an optimum dose to the electron beam dose system, thereby forming on a wafer a pattern exactly corresponding to the designed pattern even if the electron beam mask has an opening pattern differing in size from the designed pattern.

It is preferable that the measuring device comprises a detector for detecting a current of an electron beam to which the object is exposed, and a computer being electrically connected to the detector for fetching an detected current of the electron beam from the detector and calculating an actual opening area of the electron dose mask on the basis of the fetched current of the electron beam.

It is also preferable that the measuring device comprises a detector for detecting a size of an electron beam having passed through the electron exposure mask, and a computer being electrically connected to the detector for fetching an detected size of the electron beam from the detector and calculating an actual opening area of the electron dose mask on the basis of the fetched size of the electron beam.

It is also preferable that the setting device comprises a memory for previously storing informations about relationships between an opening area and an optimum dose, a computer being connected to the memory for fetching the informations about the relationships between the opening area and the optimum dose to decide an optimum dose on the basis of the calculated actual opening area of the electron mask, and a controller being electrically connected to the computer for fetching the decided optimum dose and controlling an dose time of the electron beam dose in accordance with the fetched optimum dose.

The present invention also provides a method of compensation to an electron beam dose for exposing an electron beam through an electron dose mask to an object. The method comprising the steps of measuring an actual opening area of the electron dose mask, and setting an optimum dose to the electron beam dose system with reference to the measured actual opening area of the electron dose mask, thereby forming on a wafer a pattern exactly corresponding to the designed pattern even if the electron beam mask has an opening pattern differing in size from the designed pattern.

It is also preferable that the measuring step further comprises detecting a current of an electron beam to which the object is exposed, and calculating an actual opening area of the electron dose mask on the basis of the detected current of the electron beam.

It is also preferable that the measuring step further comprises detecting a size of an electron beam having passed through the electron dose mask, and calculating an actual opening area of the electron dose mask on the basis of the size of the electron beam.

It is also preferable that the setting step further comprises referring informations about relationships between an opening area and an optimum dose to decide an optimum dose on the basis of the calculated actual opening area of the electron dose mask, and controlling an dose time of the electron beam dose in accordance with the decided optimum dose.

EMBODIMENTS

FIRST EMBODIMENT

Figure 2:
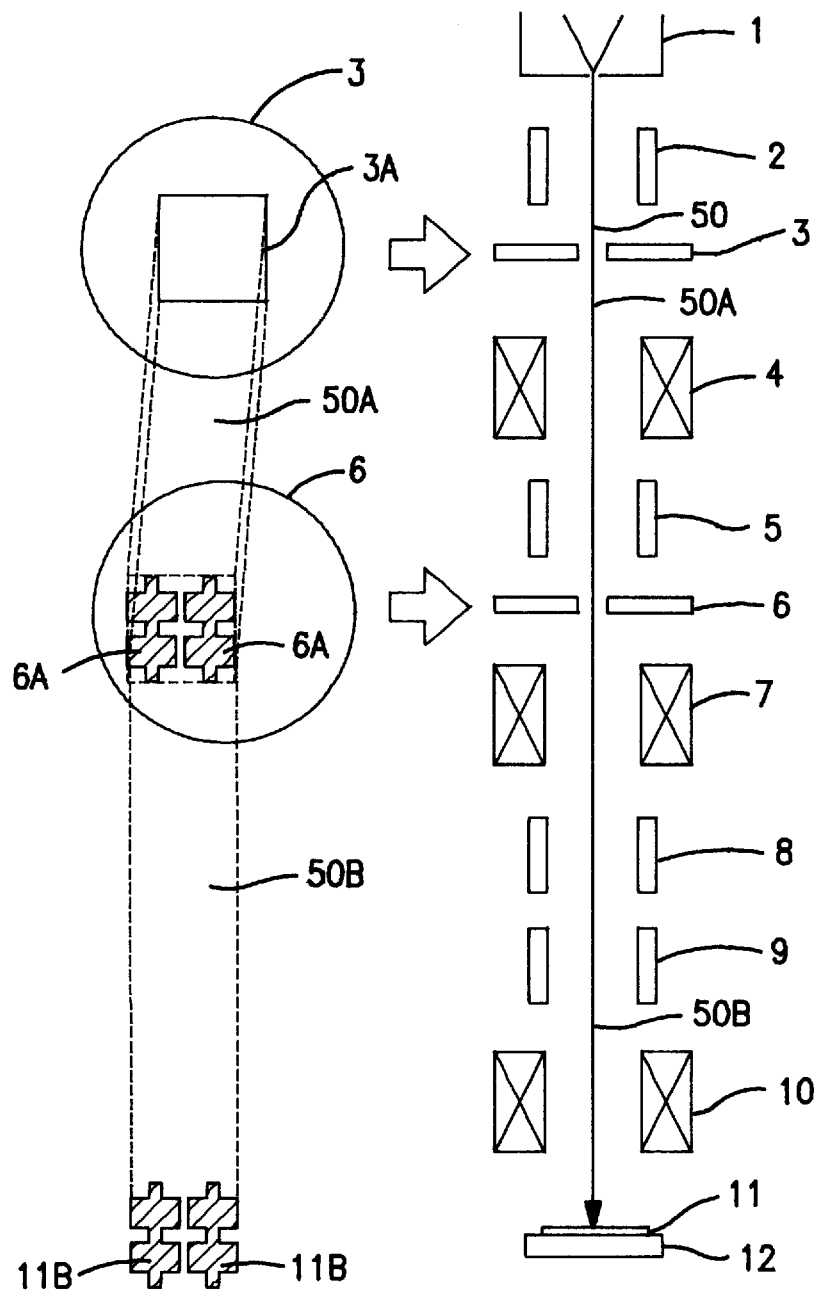
FIG. 2 is a block diagram illustrative of the second conventional electron beam dose system.
Figure 4:
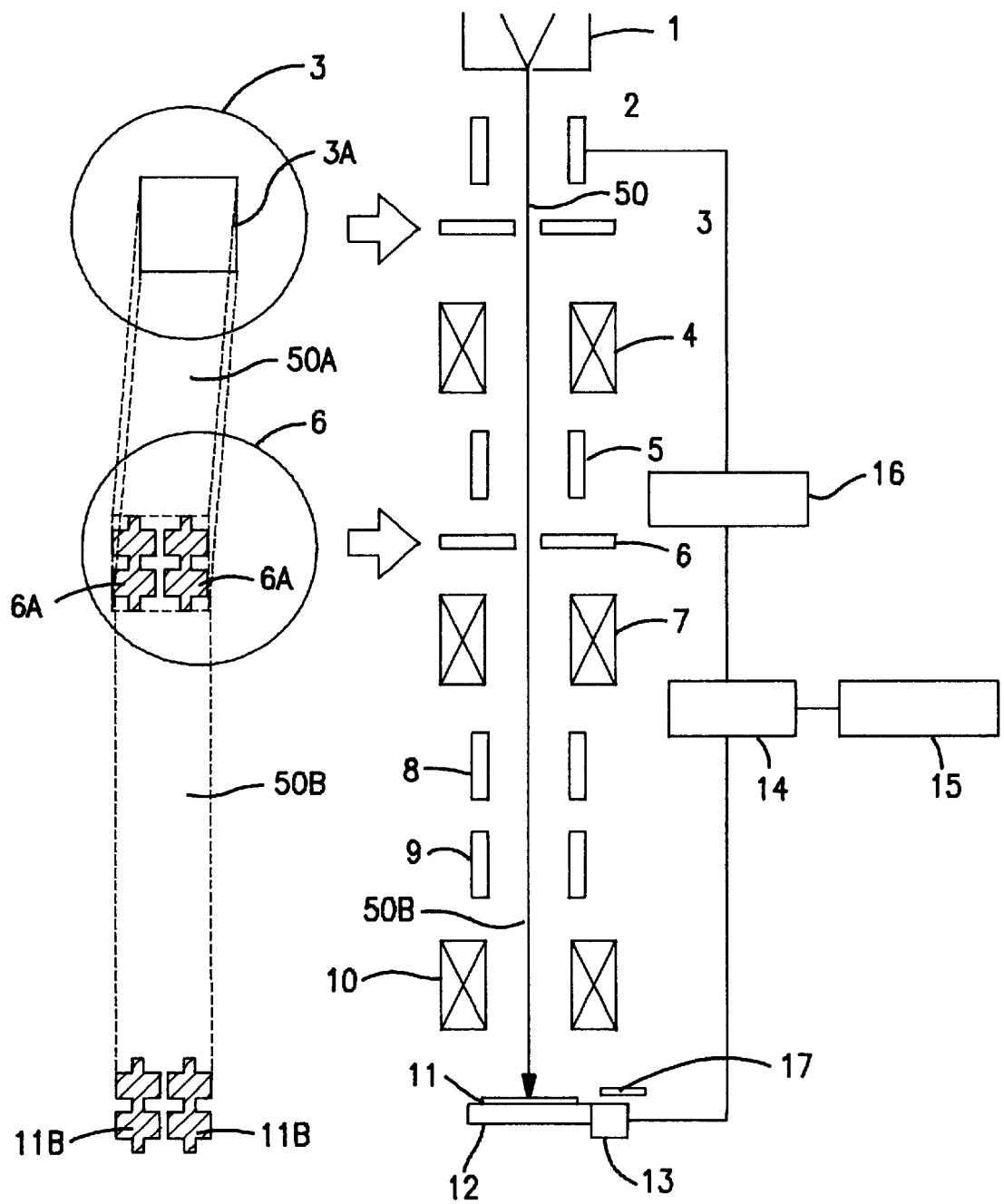
FIG. 4 is a block diagram illustrative of a novel electron beam exposure system in first and second embodiments according to the present invention.

A first embodiment according to the present invention will be described with reference to FIGS. 4 and 5. With reference to FIG. 4, the novel electron beam dose system includes the same structure as the second conventional electron beam dose illustrated in FIG. 2 and additionally has an electron beam compensation system which is capable of forming on a wafer a pattern exactly corresponding to the designed pattern even if the electron beam mask has an opening pattern differing in size from the designed pattern. The electron beam compensation system compensates an dose in accordance with an actual opening area of an electron beam mask to set an optimum dose for forming on a wafer a pattern exactly corresponding to the designed pattern even if the electron beam mask has an opening pattern differing in size from the designed pattern. The actual opening area of the electron beam mask may be measured by measuring a beam current or a beam size.

The novel one-shot electron beam dose system has an electron gun 1 which emits an electron beam 50. A sampling stage 12 is provided so that a semiconductor wafer 11 is placed on the sampling stage 12. The electron beam 50 is emitted and traveled toward the semiconductor wafer 11. A pair of blanking electrodes 2 is symmetrically provided at opposite sides of the electron beam. A first aperture 3 is provided on a straight course of the electron beam 50. The first aperture 3 is distanced from the blanking electrodes 2 in the traveling direction of the electron beam 50. The first aperture 3 has a square-shaped opening 3A so that the electron beam 50 is defined by the square-shaped opening 3A of the first aperture 3 into a square-sectioned electron beam 50A. A molded lens 4 is provided on the straight course of the electron beam 50. The molded lens 4 is distanced from the first aperture 3 in the traveling direction of the square-sectioned electron beam 50A. A pair of molded deflectors 5 is symmetrically provided at opposite sides of the traveling straight course of the square-sectioned electron beam 50A. The molded deflectors 5 are distanced from the molded lens 4 in the traveling direction of the square-sectioned electron beam 50A. A second aperture 6 is provided on the traveling straight course of the square-sectioned electron beam 50A. The second aperture 6 is distanced from the molded deflectors 5 in the traveling direction of the square-sectioned electron beam 50A. The second aperture 6 has a plurality of opening patterns 6A having been already prepared thereon as one-shot cell. The square-sectioned electron beam 50A is defined by the opening patterns 6A of the second aperture 6 into a plural pattern defined electron beam 50B having the same patterns as the plurality of opening patterns 6A. A reducing lens 7 is further provided on the traveling straight course of the plural pattern defined electron beam 50B. The reducing lens 7 is distanced from the second aperture 6 in the traveling direction of the plural pattern defined electron beam 50B. A pair of main deflectors 8 is symmetrically provided at opposite sides of the traveling straight course of the plural pattern defined electron beam 50B. The main deflectors 8 are distanced from the reducing lens 7 in the traveling direction of the plural pattern defined electron beam 50B. A pair of subordinate deflectors 9 is symmetrically provided at opposite sides of the traveling straight course of the plural pattern defined electron beam 50B. The subordinate deflectors 9 are distanced from the main deflectors 8 in the traveling direction of the plural pattern defined electron beam 50B. Further, a projection lens 10 is provided on the traveling straight course of the plural pattern defined electron beam 50B. The projection lens 10 is distanced from the subordinate deflectors 9 in the traveling direction of the plural pattern defined electron beam 50B. The rectangular-sectioned electron beam 50B is then irradiated onto the semiconductor wafer 11 held on the sampling stage 12 so that one shot dose operation of the plural pattern defined electron beam 50B onto a photo-resist over the semiconductor wafer 11 may form a complete required image pattern 11B on the photo-resist.

The novel one-shot electron beam dose system further has the electron beam compensation system capable of forming on a wafer a pattern exactly corresponding to the designed pattern even if the electron beam mask has an opening pattern differing in size from the designed pattern. The electron beam compensation system comprises an electron detector 13, a computer 14, a memory and a controller 16. The electron detector 13 is provided on the sampling stage 12 for detecting a beam current "Ib" which may be represented by the products of the current density "J" and the opening area "S" of the electron beam mask. (Ib=J×S) Normally, the current density "J" is fix, for which reason it is possible to find the opening area "S" of the electron beam mask by measuring only the beam current "Ib". The computer 14 is electrically connected to the electron detector 13 and to the memory 15 which stores on table informations of relationship between the opening area "S" of the electron beam mask and the optimum dose "D" depending upon the opening area "S". The computer 14 is operated to calculate the opening area "S" of the electron beam mask from the detected beam current "Ib" and subsequently refer the table of the memory 15 to find the optimum dose "D". The computer 14 further converts the calculated optimum dose into an dose time. The controller 16 fetches the calculated dose time from the computer 14 for controlling a voltage level to be applied to the blanking electrodes 2 so that the optimum dose D2 is decided in accordance with the actual opening area of the electron beam mask whereby the pattern having the same size as the described and intended pattern is formed on the wafer.

With reference to FIG. 5, the opening patterns illustrated in the left upper portion of FIG. 5 are free of any difference in size from the designed patterns. The opening patterns free of any difference in size from the designed patterns have a mask opening area S1. An optimum exposure D1 depends upon the mask opening area S1 of the opening patterns free of any difference in size from the designed patterns. In this case, patterns formed on the wafer has the same size as the designed patterns L1. On the other hand, if the opening patterns 6B are different in size from the designed pattern 6A as illustrated in FIG. 5, at right upper portion, then the opening area S2 of the opening patterns 6B is smaller than the opening area of the designed pattern. Since, however, an dose exposure D2 is decided optimally with reference to the opening area of the actual opening patterns 6B, then patterns are formed on the wafer which are equal in size to the designed patterns 11A. Namely, the patterns 11A have the size L2 which is equal to the designed patterns 11A.

In the above embodiment, only one pattern cell is used. Notwithstanding, the above described present invention will be applicable to the case where a plurality of the pattern cells are used. In this case, the memory 15 stores the individual relationships between the opening area and the exposure for every pattern cells.

SECOND EMBODIMENT

A second embodiment according to the present invention will be described with reference to FIGS. 4 and 5. With reference to FIG. 4, the novel electron beam dose system includes the same structure as the second conventional electron beam dose illustrated in FIG. 2 and additionally has an electron beam compensation system which is capable of forming on a wafer a pattern exactly corresponding to the designed pattern even if the electron beam mask has an opening pattern differing in size from the designed pattern. The electron beam compensation system compensates an dose in accordance with an actual opening area of an electron beam mask to set an optimum dose for forming on a wafer a pattern exactly corresponding to the designed pattern even if the electron beam mask has an opening pattern differing in size from the designed pattern. The actual opening area of the electron beam mask may be measured by measuring a beam current or a beam size.

The novel one-shot electron beam dose system has an electron gun 1 which emits an electron beam 50. A sampling stage 12 is provided so that a semiconductor wafer 11 is placed on the sampling stage 12. The electron beam 50 is emitted and traveled toward the semiconductor wafer 11. A pair of blanking electrodes 2 is symmetrically provided at opposite sides of the electron beam. A first aperture 3 is provided on a straight course of the electron beam 50. The first aperture 3 is distanced from the blanking electrodes 2 in the traveling direction of the electron beam 50. The first aperture 3 has a square-shaped opening 3A so that the electron beam 50 is defined by the square-shaped opening 3A of the first aperture 3 into a square-sectioned electron beam 50A. A molded lens 4 is provided on the straight course of the electron beam 50. The molded lens 4 is distanced from the first aperture 3 in the traveling direction of the square-sectioned electron beam 50A. A pair of molded deflectors 5 is symmetrically provided at opposite sides of the traveling straight course of the square-sectioned electron beam 50A. The molded deflectors 5 are distanced from the molded lens 4 in the traveling direction of the square-sectioned electron beam 50A. A second aperture 6 is provided on the traveling straight course of the square-sectioned electron beam 50A. The second aperture 6 is distanced from the molded deflectors 5 in the traveling direction of the square-sectioned electron beam 50A. The second aperture 6 has a plurality of opening patterns 6A having been already prepared thereon as one-shot cell. The square-sectioned electron beam 50A is defined by the opening patterns 6A of the second aperture 6 into a plural pattern defined electron beam 50B having the same patterns as the plurality of opening patterns 6A. A reducing lens 7 is further provided on the traveling straight course of the plural pattern defined electron beam 50B. The reducing lens 7 is distanced from the second aperture 6 in the traveling direction of the plural pattern defined electron beam 50B. A pair of main deflectors 8 is symmetrically provided at opposite sides of the traveling straight course of the plural pattern defined electron beam 50B. The main deflectors 8 are distanced from the reducing lens 7 in the traveling direction of the plural pattern defined electron beam 50B. A pair of subordinate deflectors 9 is symmetrically provided at opposite sides of the traveling straight course of the plural pattern defined electron beam 50B. The subordinate deflectors 9 are distanced from the main deflectors 8 in the traveling direction of the plural pattern defined electron beam 50B. Further, a projection lens 10 is provided on the traveling straight course of the plural pattern defined electron beam 50B. The projection lens 10 is distanced from the subordinate deflectors 9 in the traveling direction of the plural pattern defined electron beam 50B. The rectangular-sectioned electron beam 50B is then irradiated onto the semiconductor wafer 11 held on the sampling stage 12 so that one shot dose operation of the plural pattern defined electron beam 50B onto a photo-resist over the semiconductor wafer 11 may form a complete required image pattern 11B on the photo-resist.

The novel one-shot electron beam dose system further has a knife edge 17 which is positioned over the electron detector 13. The electron beam 50B comprises a plurality of small size electron beams. The knife edge 17 allows one of the plurality of small size electron beams to be incident into the electron detector by operations of the main and subordinate deflectors.

The novel one-shot electron beam dose system further more has the electron beam compensation system capable of forming on a wafer a pattern exactly corresponding to the designed pattern even if the electron beam mask has an opening pattern differing in size from the designed pattern. The electron beam compensation system comprises an electron detector 13, a computer 14, a memory and a controller 16. The electron detector 13 is provided on the sampling stage 12 for detecting a beam current "Ib" which may be represented by the products of the current density "J" and the opening area "S" of the electron beam mask. (Ib=J×S) Normally, the current density "J" is fixed, for which reason it is possible to find the opening area "S" of the electron beam mask by measuring only the beam current "Ib". In order to obtain the opening area of the electron beam mask, the above processes are repeated for every small size electron beams. The computer 14 is electrically connected to the electron detector 13 and to the memory 15 which stores on table informations of relationship between the opening area "S" of the electron beam mask and the optimum dose "D" for every small size electron beams. The computer 14 is operated to calculate the opening area "S" of the electron beam mask from the detected beam current "Ib" and subsequently refer the table of the memory 15 to find the optimum dose "D". The computer 14 further converts the calculated optimum dose into an dose time. The controller 16 fetches the calculated dose time from the computer 14 for controlling a voltage level to be applied to the blanking electrodes 2 so that the optimum dose D2 is decided in accordance with the actual opening area of the electron beam mask whereby the pattern having the same size as the described and intended pattern is formed on the wafer.

With reference to FIG. 5, the opening patterns illustrated in the left upper portion of FIG. 5 are free of any difference in size from the designed patterns. The opening patterns free of any difference in size from the designed patterns have a mask opening area S1. An optimum dose D1 depends upon the mask opening area S1 of the opening patterns free of any difference in size from the designed patterns. In this case, patterns formed on the wafer has the same size as the designed patterns L1. On the other hand, if the opening patterns 6B are different in size from the designed pattern 6A as illustrated in FIG. 5, at right upper portion, then the opening area S2 of the opening patterns 6B is smaller than the opening area of the designed pattern. Since, however, an dose D2 is decided optimally with reference to the opening area of the actual opening patterns 6B, then patterns are formed on the wafer which are equal in size to the designed patterns 11A. Namely, the patterns 11A have the size L2 which is equal to the designed patterns 11A.

In the above embodiment, only one pattern cell is used. Notwithstanding, the above described present invention will be applicable to the case where a plurality of the pattern cells are used. In this case, the memory 15 stores the individual relationships between the opening area and the dose for every pattern cells.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A compensation device for compensating an electron beam dose to an object, said device being provided in an electron beam dose system utilizing an electron dose mask, said compensation device comprising:

a detector for detecting a current of an electron beam to which said object is exposed;

a memory for previously storing informations about relationships between an opening area and an optimum dose;

a computer being electrically connected to said detector for fetching a detected current of said electron beam from said detector and calculating an actual opening area of said electron dose mask on the basis of said fetched current of said electron beam, and said computer being also connected to said memory for fetching said informations about said relationships between said opening area and said optimum dose to decide an optimum dose on the basis of said calculated actual opening area of said electron dose mask; and a controller being electrically connected to said computer for fetching said decided optimum dose and controlling a dose time of said electron beam dose in accordance with said fetched optimum dose.

2. A compensation device for compensating an electron beam dose to an object, said device being provided in an electron beam dose system utilizing an electron dose mask, said compensation device comprising:

a detector for detecting a size of an electron beam having passed through said electron dose mask;

a memory for previously storing informations about relationships between an opening area and an optimum dose;

a computer being electrically connected to said detector for fetching a detected size of said electron beam from said detector and calculating an actual opening area of said electron dose mask on the basis of said fetched size of said electron beam, and said computer being also connected to said memory for fetching said informations about said relationships between said opening area and said optimum dose to decide an optimum dose on the basis of said calculated actual opening area of said electron dose mask; and a controller being electrically connected to said computer for fetching said decided optimum dose and controlling a dose time of said electron beam dose in accordance with said fetched optimum dose.

3. An electron beam dose system comprising:

a sampling stage for holding a wafer;

an emitter for emitting an electron beam toward said wafer;

an optical system being provided between said emitter and said sampling stage for allowing a travel of said electron beam onto said wafer, said optical system having at least an electron beam mask having an opening pattern through which said electron beam is defined and passes; and an electron beam compensation system further comprising:

a detector for detecting a current of an electron beam to which said object is exposed;

a memory for previously storing informations about relationships between an opening area and an optimum dose;

a computer being electrically connected to said detector for fetching a detected current of said electron beam from said detector and calculating an actual opening area of said electron dose mask on the basis of said fetched current of said electron beam, and said computer being also connected to said memory for fetching said informations about said relationships between said opening area and said optimum dose to decide an optimum dose on the basis of said calculated actual opening area of said electron dose mask; and a controller being electrically connected to said computer for fetching said decided optimum dose and controlling a dose time of said electron beam dose in accordance with said fetched optimum dose.

4. An electron beam dose system comprising:

a sampling stage for holding a wafer;

an emitter for emitting an electron beam toward said wafer;

an optical system being provided between said emitter and said sampling stage for allowing a travel of said electron beam onto said wafer, said optical system having at least an electron beam mask having an opening pattern through which said electron beam is defined and passes; and an electron beam compensation system further comprising:

a detector for detecting a size of an electron beam having passed through said electron beam mask;

a memory for previously storing informations about relationships between an opening area and an optimum dose;

a computer being electrically connected to said detector for fetching a detected current of said electron beam from said detector and calculating an actual opening area of said electron dose mask on the basis of said fetched size of said electron beam, and said computer being also connected to said memory for fetching said informations about said relationships between said opening area and said optimum dose to decide an optimum dose on the basis of said calculated actual opening area of said electron dose mask; and a controller being electrically connected to said computer for fetching said decided optimum dose and controlling a dose time of said electron beam dose in accordance with said fetched optimum dose.

5. A compensation device for compensating an electron beam dose to an object, said compensation device being provided in an electron beam dose system utilizing an electron dose mask, said compensation device comprising:

a measuring device for measuring an actual opening area of said electron dose mask; and a setting device being electrically connected to said measuring device for fetching said measured actual opening area of said electron dose mask and setting an optimum dose to said electron beam dose system.

6. The compensation device as claimed in claim 5, wherein said measuring device comprises:

a detector for detecting a current of an electron beam to which said object is exposed; and a computer being electrically connected to said detector for fetching an detected current of said electron beam from said detector and calculating an actual opening area of said electron dose mask on the basis of said fetched current of said electron beam.

7. The compensation device as claimed in claim 5, wherein said measuring device comprises;

a detector for detecting a size of an electron beam having passed through said electron dose mask; and a computer being electrically connected to said detector for fetching an detected size of said electron beam from said detector and calculating an actual opening area of said electron dose mask on the basis of said fetched size of said electron beam.

8. The compensation device as claimed in claim 5, wherein said setting device comprises:

a memory for previously storing informations about relationships between an opening area and an optimum dose;

a computer being connected to said memory for fetching said informations about said relationships between said opening area and said optimum dose to decide an optimum dose on the basis of said calculated actual opening area of said electron dose mask; and a controller being electrically connected to said computer for fetching said decided optimum dose and controlling an dose time of said electron beam dose in accordance with said fetched optimum dose.

9. An electron beam dose system comprising:

a sampling stage for holding a wafer;

an emitter for emitting an electron beam toward said wafer;

an optical system being provided between said emitter and said sampling stage for allowing a travel of said electron beam onto said wafer, said optical system having at least an electron beam mask having an opening pattern through which said electron beam is defined and passes; and an electron beam compensation system further comprising:

a measuring device for measuring an actual opening area of said electron dose mask; and a setting device being electrically connected to said measuring device for fetching said measured actual opening area of said electron dose mask and setting an optimum dose to said electron beam dose system.

10. The electron beam dose system as claimed in claim 9, wherein said measuring device comprises:

a detector for detecting a current of an electron beam to which said object is exposed; and a computer being electrically connected to said detector for fetching an detected current of said electron beam from said detector and calculating an actual opening area of said electron dose mask on the basis of said fetched current of said electron beam.

11. The electron beam dose system as claimed in claim 9, wherein said measuring device comprises:

a detector for detecting a size of an electron beam having passed through said electron dose mask; and a computer being electrically connected to said detector for fetching an detected size of said electron beam from said detector and calculating an actual opening area of said electron dose mask on the basis of said fetched size of said electron beam.

12. The electron beam dose system as claimed in claim 9, wherein said setting device comprises:

a memory for previously storing informations about relationships between an opening area and an optimum dose;

a computer being connected to said memory for fetching said informations about said relationships between said opening area and said optimum dose to decide an optimum dose on the basis of said calculated actual opening area of said electron dose mask; and a controller being electrically connected to said computer for fetching said decided optimum dose and controlling a dose time of said electron beam dose in accordance with said fetched optimum dose.

13. A method of compensation to an electron beam dose system for exposing an electron beam through an electron dose mask to an object, said method comprising the steps of:

measuring an actual opening area of said electron dose mask; and setting an optimum dose to said electron beam dose system with reference to said measured actual opening area of said electron dose mask.

14. The method as claimed in claim 13, wherein said measuring step further comprises:

detecting a current of an electron beam to which said object is exposed; and calculating an actual opening area of said electron dose mask on the basis of said detected current of said electron beam.

15. The method as claimed in claim 13, wherein said measuring step further comprises:

detecting a size of an electron beam having passed through said electron dose mask; and calculating an actual opening area of said electron dose mask on the basis of said size of said electron beam.

16. The method as claimed in claim 13, wherein said setting step further comprises:

referring informations about relationships between an opening area and an optimum dose to decide an optimum dose on the basis of said calculated actual opening area of said electron dose mask; and controlling an dose time of said electron beam dose exposure in accordance with said decided optimum dose.

* * * * *